United States Patent [19]

Aull et al.

[11] Patent Number: 4,985,621

[45] Date of Patent: Jan. 15, 1991

[54] ELECTROOPTICAL SWITCH WITH SEPARATE DETECTOR AND MODULATOR MODULES

[75] Inventors: Brian F. Aull, Cambridge; Kirby B. Nichols, Chelmsford; T. C. L. Gerhard Sollner, Winchester, all of Mass.

[73] Assignee: Massachusetts Institute of Technology, Cambridge, Mass.

[21] Appl. No.: 336,109

[22] Filed: Apr. 11, 1989

[51] Int. Cl.$^5$ .............................................. H01J 31/50
[52] U.S. Cl. .................. 250/213 A; 455/601; 455/605
[58] Field of Search ................... 250/213 A; 350/355, 350/356, 374; 357/211 J, 19; 455/601, 603, 605, 606

[56] References Cited

U.S. PATENT DOCUMENTS

| | | |
|---|---|---|
| 4,577,189 | 3/1986 | Adolfsson et al. ............. 250/213 A |
| 4,754,132 | 6/1988 | Hinton et al. .................... 250/213 A |
| 4,782,223 | 11/1988 | Suzuki ............................. 250/213 A |
| 4,800,262 | 1/1989 | Lentine ........................... 250/213 A |

OTHER PUBLICATIONS

Sakaki et al., "Novel Quantum-Well Optical Bistability Device with Excellent On/Off Ratio and High Speed Capability," *Electronics Letters*, vol. 24, p. 1 (1988).
Miller et al., "The Quantum Well Self-Electrooptic Effect Device: Optoelectronic Bistability and Oscillation, and Self-Linearized Modulation," *IEEE Journal of Quantum Electronics*, vol., QE-21, No. 9, Sep. 1985, pp. 1462-1476.

*Primary Examiner*—David C. Nelms
*Assistant Examiner*—Que Tan Le
*Attorney, Agent, or Firm*—Fish & Richardson

[57] ABSTRACT

An electrooptical switch for modulating a bias light beam in response to a control beam. The switch includes a modulator for modulating the bias beam to produce an output light beam therefrom, the modulator having a variable transmissivity; a detector module for receiving the control beam and generating a control signal therefrom, the detector module exhibiting switching operation in response to the control beam; and an amplifier for amplifiying the control signal to modulate the transmissivity of the modulator.

27 Claims, 4 Drawing Sheets

ELECTROOPTICAL SWITCH WITH SEPARATE DETECTOR AND MODULATOR MODULES

The Government has rights in this invention pursuant to Contract Number F19628-85-C-0002 awarded by the Office of the Air Force.

BACKGROUND OF THE INVENTION

This invent generally relates to electrooptical devices.

Photons, like electrons, can carry information from one place to another. Photons, however, have some distinct advantages over electrons which make them a particularly attractive transmission media. For example, photons generally do not interact with each other as do electrons. Consequently, different light beams can pass through one another or share the same optical fiber without resulting in crosstalk between the beams. In addition, the electromagnetic spectrum associated with photons covers much higher frequencies than the electromagnetic spectrum associated with electronic communication. Thus, the information-carrying capability of a light beam is correspondingly higher than that of an electronic signal. Furthermore, light beams need not be confined to an optical fiber or a waveguide whereas electrons must be confined to a wire or other conductive path. As a result, light beams can simultaneously communicate information to many members within an array of receivers without requiring a complex network of interconnections. And, of course, light signals can move through a circuit at a rate limited only by its velocity of propagation and not limited by RC (i.e. resistance-capacitance) charging times.

Attempts to construct circuits which process light signals rather than electrical signals have met with significant obstacles, however. A major problem has been the scarcity of optical devices which are analogous to the different electrical devices used in electronic circuits. For example, there has been no satisfactory optical device comparable to a flip-flop, the fundamental building block of most digital computers. Indeed, because photons do not interact with each other, it has been difficult to design such a device, or, for that matter, any device in which one light beam modulates another light beam.

SUMMARY OF THE INVENTION

In general, in one aspect, the invention features an electrooptical switch for modulating a bias light beam in response to an excitatory light beam. The electrooptic switch includes a modulator for modulating the bias beam to produce an output light beam therefrom, the modulator having a variable transmissivity; a detector module for receiving the excitatory beam and generating a control signal therefrom, the detector module exhibiting switching operation in response to the excitatory beam; and an amplifier for amplifying the control signal to modulate the transmissivity of the modulator.

Preferred embodiments include the following features. The modulator is a PIN diode having a multiple quantum well structure. The amplifier is a field-effect transistor. And the detector module includes an excitatory optical detector adapted to receive the excitatory beam and produce an electric current which changes in response to changes in the excitatory beam; and a nonlinear component responsive to the current generated by the excitatory detector for generating the control signal, the nonlinear component having a current-voltage characteristic exhibiting a negative differential resistance. Also, the excitatory detector is a PIN diode having a multiple quantum well structure and the nonlinear component is a resonant tunneling diode. In the invention, the excitatory control beam causes the transmissivity of the modulator to switch from a first level to a second level when its power reaches a preselected threshold.

In another aspect, the detector module further includes an inhibitory optical detector for receiving an inhibitory control beam and causing the preselected threshold to increase in response to the inhibitory control beam.

In yet another aspect, the detector module also includes a current source for biasing the nonlinear component so that it has at least two stable points of operation in the absence of incident light on the detector module. In a preferred embodiment, the current source is a field-effect transistor.

In general, in another embodiment, the invention features a two-terminal electrooptical switch which responds to an input light beam to produce an output beam that switches from on stable state to a second stable state. The two-terminal switch includes a modulator for receiving the input beam and producing a photocurrent therefrom, the modulator having a transmissivity which varies as a function of a voltage across the modulator; a nonlinear component connected to receive the current generated by the modulator and produce a corresponding voltage therefrom, the nonlinear component having a region of operation which exhibits negative differential resistance; and an amplifier for amplifying the voltage produced by the nonlinear component and feeding the amplified voltage back to the modulator.

Preferred embodiments include the following features. The modulator is a PIN diode having a multiple quantum well structure; the amplifier is a field-effect transistor; and the nonlinear component is a resonant tunneling diode.

An advantage of the invention is that it exhibits gain. That is, a low power control beam can modulate or switch a much higher power bias beam. Thus, switches constructed in accordance with the invention have capability of fanout, making them very useful as a building blocks in optoelectronic neural networks and optical computing systems.

Another advantage of the invention is that it exhibits a switching point which has a sharp threshold and is capable of generating an output having well defined on/off intensities.

Yet another advantage is that the invention is fully integratable. Indeed, the invention may be constructed as a monolithic structure by using standard integrated circuit fabrication techniques.

Other advantages and features will become apparent from the following description of the preferred embodiment, and from the claims.

DESCRIPTION OF THE PREFERRED EMBODIMENT

STRUCTURE AND OPERATION

Figure 1:
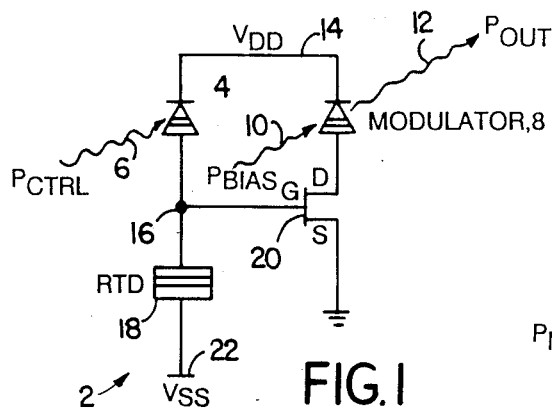
FIG. 1 depicts the schematic diagram of a bistable electrooptic device which embodies the invention.

Referring to FIG. 1, a bistable electrooptical device (BED) 2 embodying the invention comprises a detector 4, which responds to a control light beam 6, and a modulator 8, which modulates a bias light beam 10 passing through it to produce a modulated output light beam 12. The detector 4 is connected between a $V_{DD}$ voltage supply line 14 and a node 16. Also connected to node 16, is one terminal of a resonant tunneling diode (RTD) 18 and the gate terminal of a field effect transistor (FET) 20. The other terminal of RTD 18 is connected to a $V_{SS}$ voltage supply line 22. Modulator 8 is connected between the drain terminal of FET 20 and $V_{DD}$ supply line 14. The source terminal of FET 20 is connected to ground. In the preferred embodiment, both detector 4 and modulator 8 are PIN diodes in which the I-region is a multiple quantum well structure, referred to hereinafter as PIN/MQWS devices.

Figure 2:
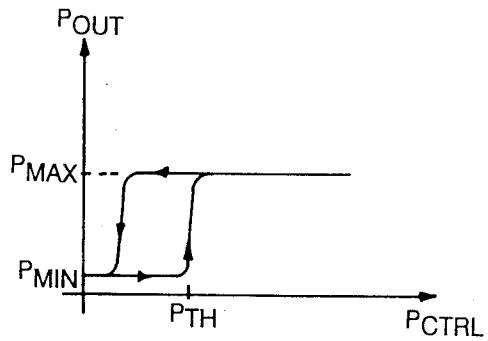
FIG. 2 depicts the input-output characteristics of a bistable electrooptic device which embodies the invention.

BED 2 exhibits the characteristics which are graphically depicted in FIG. 2, in which the $P_{out}$-axis indicates the power of the output beam 12 and the $P_{ctrl}$-axis indicates the power of the control beam 6. An important and extremely useful characteristic of BED 2 is that it exhibits bistable operation similar to that exhibited by a flip-flop such as is used in electronic logic circuits. That is, the control beam 6 can cause the output beam 12 to switch between two stable, relatively constant output levels, namely, $P_{max}$ and $P_{min}$. It should be noted that although the BED 2 shown in FIG. 2 exhibits hysteresis, it may be desirable in some applications to have a switching characteristic without hysteresis. As will become apparent from the following description, this can be achieved by proper construction of BED 2.

Another very important characteristic of BED 2 is that it exhibits gain. That is, an independent low power control beam 6 can modulate a much higher power bias beam 10, so that the device displays large signal gain. Thus, for example, using current technology it should be relatively easy to build a BED 2 in which a one microwatt control beam 6 can modulate a 30 microwatt bias beam 10, causing the output beam 12 to switch between a $P_{min}$ of less than 12 microwatts and a $P_{max}$ greater than 24 microwatts. Such gain gives BED 2 fanout capability, meaning that it can drive the inputs of many other similar devices.

Figure 3:
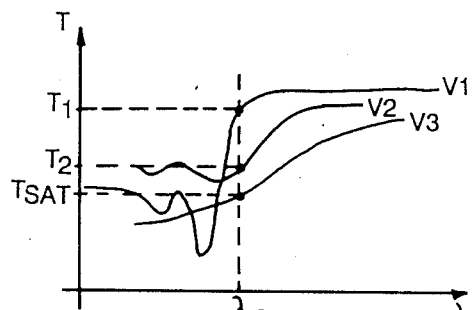
FIG. 3 depicts the characteristics of a PIN multiple quantum well device.

To understand the operation of BED 2, it is useful to examine the current-voltage (I-V) characteristics of the individual components of which it is constructed. If both detector 4 and modulator 8 are PIN/MQWS's, they generally behave as is illustrated graphically in FIG. 3, in which the T-axis indicates the transmissivity of the PIN/MQWS and the λ-axis indicates the wavelength of the light incident on the MQWS. Each curve is represents the transmissivity versus wavelength of the PIN/MQWS for a corresponding voltage across the device, namely, $V_1$, $V_2$, or $V_3$. For light of wavelength $\lambda_{ctrl}$, the corresponding transmissivities are $T_1$, $T_2$, and $T_{sat}$, respectively. Notice that at large voltages, such as $V_3$, the optical modulation of the PIN/MQWS saturates, yielding a transmissivity of $T_{sat}$, which does not change appreciably with further increases in voltage.

Figure 4:
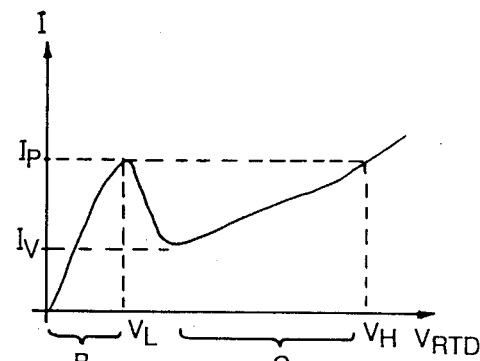
FIG. 4 depicts the I-V characteristics of a resonant tunneling diode.

The current-voltage characteristics of RTD 18 are graphically illustrated in FIG. 4. RTD 18 exhibits the negative differential resistance region which is characteristic of resonant tunneling diodes, i.e. RTD 18 is a nonlinear device. The negative differential resistance plays an important role in producing the bistable operation of BED 2. It should be readily apparent, that other devices or circuits which also possess nonlinearities may also be used in place of the resonant tunneling diode. In addition, by shunting RTD 18 with an appropriate positive resistance, it is theoretically possible to effectively achieve an infinite resistance in the region of operation which previously exhibited a negative differential resistance. Such a structure is useful in generating operating characteristics of BED 2 which do not exhibit hysteresis. Also note in FIG. 4, that $I_p$ and $I_v$ designate the peak current and the valley current, respectively.

Figure 5:
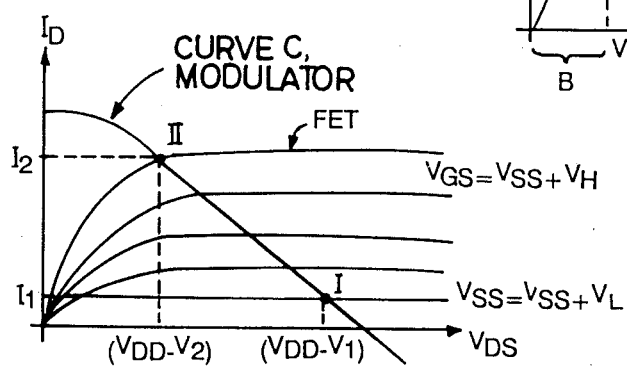
FIG. 5 depicts the I-V characteristics of a field effect transistor including a loadline corresponding to a PIN multiple quantum well device receiving a given intensity of incident light.

FET 20 is a depletion mode field effect transistor which has the characteristics shown in FIG. 5 where $I_D$ is the drain current, $V_{DS}$ is the drain-to-source voltage and $V_{GS}$ is the gate-to-source voltage. (Also shown in FIG. 5 is a loadline corresponding to a PIN/MQWS illuminated with a bias beam, the significance of which will be explained shortly.)

Figure 6:
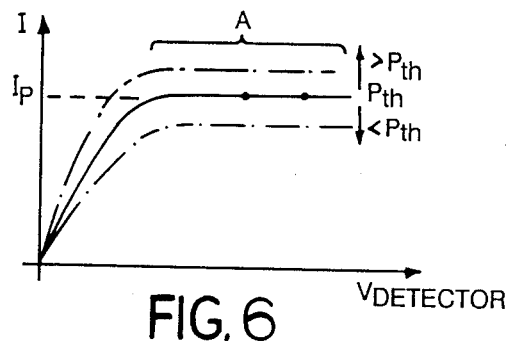
FIG. 6 illustrates the I-V characteristics of the detector element shown in FIG. 1.

When BED 2 is biased with voltage supplies $V_{DD}$ and $V_{SS}$, detector 4 operates in its region of saturation, labeled A in FIG. 6. In addition, the size of RTD 18 is such that when the power of the control beam 6 is equal to the desired threshold at which switching of BED 2 to a higher output level is to occur, namely, $P_{th}$, detector 4 generates a current which is approximately equal to $I_p$, the peak current of RTD 18. Thus, when the power of the control beam 6 is increased above $P_{th}$, the voltage across RTD 18 switches from $V_L$ to $V_H$, i.e., RTD 18 switches from a low voltage region (labelled B in FIG. 4) to a high voltage region (labelled C in FIG. 4). RTD 18 remains in the high voltage region C until the power of the control beam 6 causes the current through detector 4 to drop below $I_v$. At that time, RTD 18 drops back to the low voltage region B where the voltage across RTD 18 is less than $V_L$.

Figure 7:
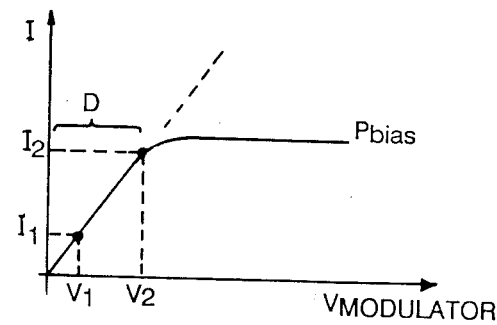
FIG. 7 illustrates the I-V characteristics of the modulator element shown in FIG. 1.

In contrast to detector 4, modulator 8 operates within its linear region D as shown in FIG. 7. Thus, at a fixed level of incident light on modulator 8, changing the voltage across modulator 8 produces a change in its transmissivity and a corresponding change in the photocurrent produced by it. The effective resistance of modulator 8 in this region of operation is designated as R.

FET 20 serves to amplify the voltage swing produced by RTD 18 to yield a larger voltage swing across modulator 8. The operation of FET 20 and modulator 8 is graphically illustrated in FIG. 5. Curve C is the load line produced by modulator 8. As the gate voltage, $V_{GS}$, switches from $Vss+V_L$ to $Vss+V_H$, the operating point of FET 20 switches from point I, at which the drain current is $I_1$, to point II, at which the drain current is $I_2$. As should be apparent from FIGS. 7 and 3, this causes the voltage across modulator 8 to switch from $V_1$ to $V_2$, resulting in a corresponding change in the transmissivity of the modulator 8. If the wavelength of the light is selected to be above the absorption peak of the PIN/MQWS, then modulator 8 will switch from a "transparent" state to an "opaque" state, namely, from a transmissivity of $T_1$ to a transmissivity of $T_2$. If one chooses a wavelength on the absorption peak, then it switches from opaque to transparent, yielding the characteristics shown in FIG. 2.

The change in the voltage across modulator 8 is related to the change in voltage across RTD 18 as follows:

$$V_2 - V_1 = g_m * R * (V_H - V_L)$$

where $g_m$ is the transconductance of FET 20. Clearly, by choosing a FET 20 having a sufficiently high transconductance it is possible to obtain gain greater than one. In that case, FET 20 helps produce larger changes in the transmissivity of modulator 8 than would be achievable from the voltage swing produced by RTD 18 alone.

Figure 8:
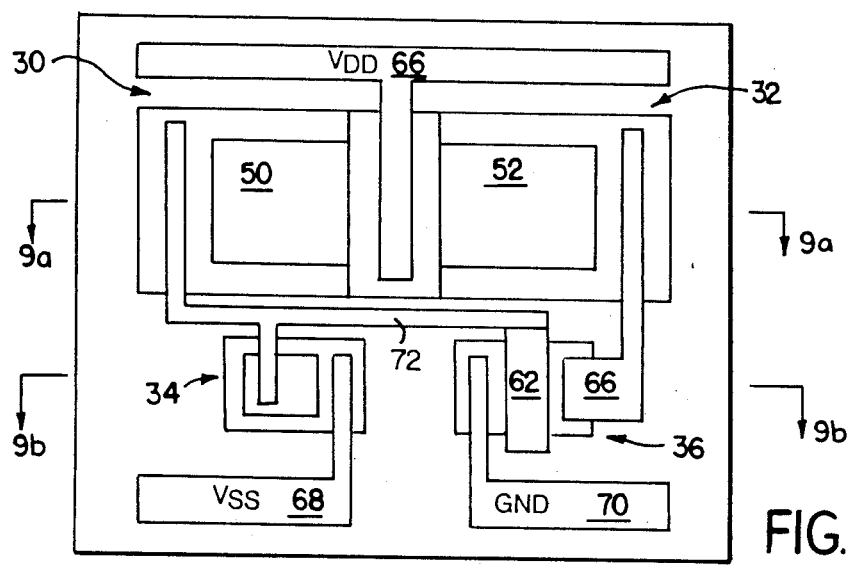
FIG. 8 is a top view illustrating a monolithic version of the bistable electrooptic device shown in FIG. 1.

A significant advantage of the BED 2 described above is that it can be fabricated as a monolithic structure on the surface of a semiconductor substrate using conventional integrated circuit fabrication technology. Thus, for example, a BED can be fabricated by using GaAs as a substrate and molecular beam epitaxy as the method for forming the layers which make up the different devices within the BED. FIGS. 8 and 9-b illustrate one such structure incorporating the components described above. Notice, however, that dimensions in the figures are grossly out of proportion so that it is possible to effectively illustrate the structure.

The structure includes a PIN/MQWS detector 30, a PIN/MQWS modulator 32, a RTD 34 and an FET 36. PIN/MQWS detector 30 includes a p-type region 38, a multiple quantum well region 40 and an n-type region 42. Similarly, PIN/MQWS modulator 32 also includes a p-type region 44, a multiple quantum well region 46 and an n-type region 48. Both multiple quantum well regions 40 and 46 are made of alternating layers of GaAs and $Al_xGa_{1-x}As$. Above the p-type regions 38 and 44 are multi-layer dielectric reflectors 50 and 52 which serve as quarter wavelength stacks designed for a particular wavelength of light. The layers in the stacks have thicknesses equal to one quarter wavelength and may be constructed of $Al_xGa_{1-x}As$ in which the percentage of aluminum is typically varied from 20% to 90%, from layer to layer, to cause the index of refraction of neighboring layers to alternate between high and low values to achieve the desired filtering characteristics.

RTD 34 includes an n-type region 54, a barrier region 56 and an n-type region 58. The barrier region 56 consists of two undoped $Al_xGa_{1-x}As$ layers separated by a layer of undoped GaAs.

Finally, FET 36 includes an n-type region 60, and a gate metalization 62 which forms a Schottky barrier at its interface with the surface of the n-type region 60.

Of course, an obvious benefit of using integrated circuit fabrication techniques to produce the BED 2 is that the formation of corresponding regions of the different devices may be take place during the corresponding epitaxial growth steps. It should be readily apparent that the structure illustrated in FIGS. 8, 9a and 9b may be fabricated by fully exploiting this benefit. Thus, for example, the n-type regions 42, 48 and 54 of detector 30, modulator 32 and RTD 34, respectively, are all formed during the growth step. The multiple quantum well regions of detector 30 and modulator 32 are simultaneously grown during the next sequence of growth steps.

Figure 9A:
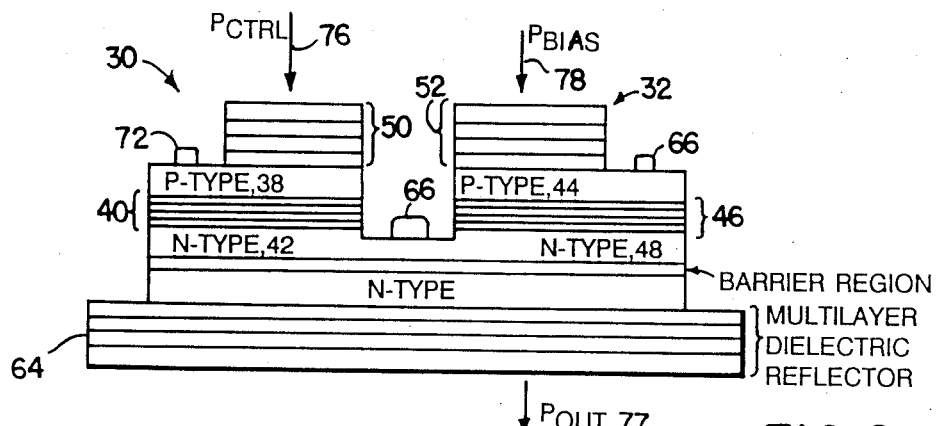
FIG. 9a is a cross-sectional view of the structure shown in FIG. 8.
Figure 9B:
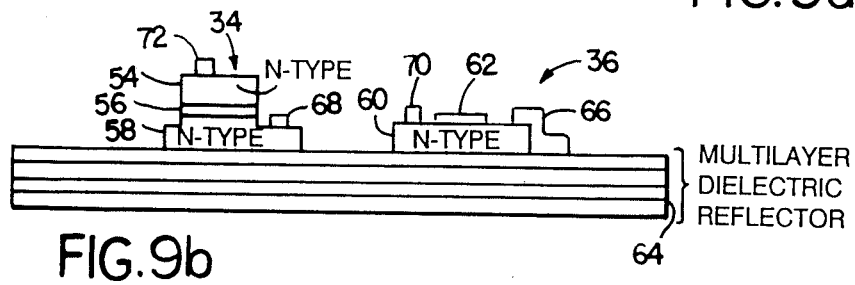
FIG. 9b is another cross-sectional view of the structure shown in FIG. 8.

As shown in FIGS. 9a and 9b, all of the devices 30, 32, 34 and 36 rest on a second multi-layer dielectric reflector 64. The combination of the multi-layer dielectric reflector 64 with the other dielectric reflector 52 forms a Fabry-Perot cavity, the purpose of which is to achieve a higher contrast modulator.

In addition, it may be desirable to grow a transparent mechanical support layer (not shown) beneath dielectric layer 64 before growing the other layers shown in FIG. 9 to provide support for the structure.

Methods of growing these layers are, of course, well known. They include, for example, molecular beam epitaxy (MBE) and organometallic chemical vapor deposition (OMCVD). Furthermore, it should also be readily apparent that the different layers are first grown and then the various components are formed from the resulting multi-layered structure by etching away material where appropriate to form islands representing the corresponding components.

The different components of the BED are interconnected by the metalizations shown most clearly in FIG. 8. A $V_{dd}$ supply line metalization 66 makes electrical connections to the n-type regions 42 and 48 of detector 30 and modulator 32, respectively. A $V_{ss}$ supply line metalization 68 makes an electrical connection to the n-type region 58 of RTD 34. A ground metalization 70 makes an electrical connection to one end of the n-type region 60 of FET 36. The other end of the n-type region 6 is electrically connected to the p-type region 44 of modulator 32 by a metalization 66. Finally, a metalization 72 electrically interconnects the p-type region 38 of detector 30, the n-type region 54 of RTD 34 and the gate metalization 62 of FET 36. An insulating layer (not shown) separates the metalizations from the areas in which electrical contact is not desired and ohmic contacts exist at appropriate locations to create the electrical connections to the different layers of the structure.

The input and output light beams are shown by the dark arrows in FIG. 9a. Multi-layer reflector 50 of detector 30 receives a control beam 76 and multi-layer reflector 52 receives a bias beam 78. The modulated light beam passes out of the other side of the structure as output beam 77. The control beam 76 is also partially transmitted through detector 30 and appears as an output beam, which is ignored. Of course, it should also be apparent that the device can be designed to operate in a reflected mode in which the output beam is reflected back up through the structure so that it exits through the multilayer dielectric reflector 52 which receives the bias beam 78.

Figure 10:
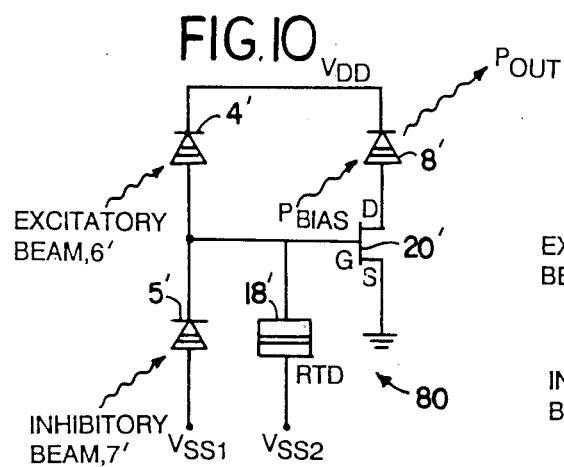
FIG. 10 depicts an electrooptic device.

BED 2 illustrated in FIG. 1 responds to the excitatory stimulation of a single control beam 6. In constructing networks to simulate the operation of biological systems in which neurons respond to both excitatory and inhibitory inputs, however, it is very desirable to have a switching or bistable electrooptical device which also responds to both inhibitory and excitatory inputs. An alternative embodiment of the invention, which may be referred to as an electrooptical neuron 80 and is illustrated in FIG. 10, includes both a excitatory detector 4', corresponding to the detector 4 in FIG. 1, and an inhibitory detector 5', which may be a device similar to the device used for detector 4'. In all other respects the circuit is schematically the same as the BED 2 shown in FIG. 1. The neuron 80 includes an RTD 18', an FET 20', and a modulator element 8', which correspond to RTD 18, FET 20 and modulator element 8, respectively, of BED 2 in FIG. 1. An excitatory beam 6' drives detector 4' and an inhibitory beam 7' drives detector 5'. Detector 5', like detector 4', is operated in its modulation saturation region.

In the configuration shown in FIG. 10, it should be readily apparent that the inhibitory beam 7' tends to counter the effect of the excitatory beam 6' by causing a portion of the current generated by excitatory detector 4' to bypass RTD 18'. This prevents RTD 18' from entering its negative differential resistance region where switching to a different voltage level occurs. The degree to which it inhibits the action of the excitatory detector 4' on RTD 18', of course, varies in proportion to the power of the inhibitory beam 7'.

Note that the description which follows assumes operation at a wavelength which yields the characteristics of FIG. 2.

The devices described above share the characteristic that the modulators 8 and 8' will remain in their high transmissivity states only so long as sufficient excitatory signal is applied to detectors 4 and 4'. An alternative embodiment shown in FIG. 11 does not share this characteristic. The alternative embodiment, which may be referred to as a latching bistable electrooptic device 90, is similar to the electrooptic neuron shown in FIG. 10 except for the addition of an FET 23". That is, the latching device 90 includes an excitatory detector 4", an inhibitory detector 5", an RTD 18" and a FET 20" which correspond to excitatory detector 4', inhibitory detector 5', RTD 18' and FET 20' of electrooptical neuron 80. The additional FET 23", with its gate and source terminals interconnected, is connected across the excitatory detector 4".

Figure 11:
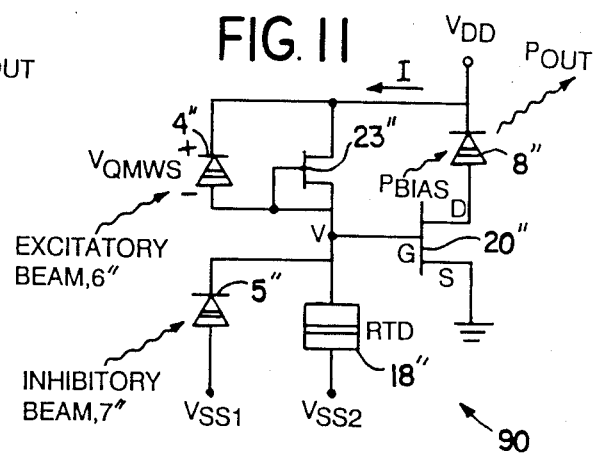
FIG. 11 depicts a latching bistable electrooptic device.
Figure 12:
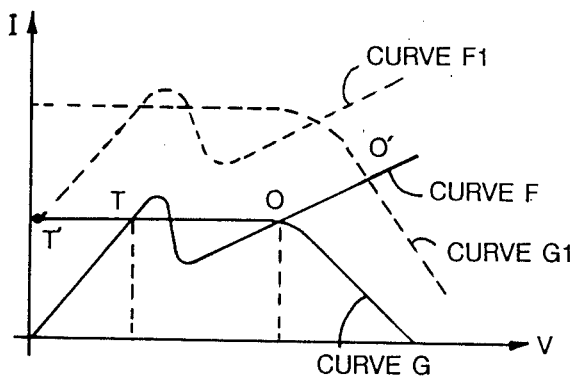
FIG. 12 illustrates the I-V characteristics of parts of the device shown in FIG. 11.

The operation of latching device 90 can be more easily understood with the aid of FIG. 12 which shows I-V characteristics for the portion of the circuit driving the gate of FET 20". Curve F is the I-V characteristic of the combination of RTD 18" and inhibitory detector 5" when no light is falling on detector 5". When detector 5" is stimulated by light, curve F moves up as shown by curve F1. Curve G is the load line corresponding to the I-V characteristic of the combination FET 23" and excitatory detector 4" when no light is falling on detector 4". When detector 4" is stimulated by light, curve G moves up as shown by curve G1. The voltage is measured across RTD 18" and the convention for current I is as shown in FIG. 11. The gate current of FET 20" is assumed to be negligible.

The intersections, T and O, of the two curves indicate the operating points of the circuit which drives the gate terminal of FET 20". Clearly, if the characteristics of FET 23" and RTD 18" are selected as indicated in FIG. 12, then the latch device 90 has the two stable operating points indicated by "O" and "T" where "O" corresponds to an opaque state for modulator 8" and "T" corresponds to a transparent state. The device operates as follows.

If device 90 is in state O and light is shined on detector 5" so that curve F moves up to curve F1, then device 90 will switch to state T' and will be in state T after the light is removed. On the other hand, if device 90 is in state T and light is shined on detector 4" so that curve G moves up to curve G1, then device 90 will switch to state O' and will be in state O after the light is removed. It should be clear that neither detector 4" nor detector 5" needs to receive light for either state to be maintained. That is, both beams 6" and 7" may be off without disrupting the state of device 90. This is because FET 23" acts as a current source which keeps RTD 18" biased in the desired region of operation.

Figure 13:
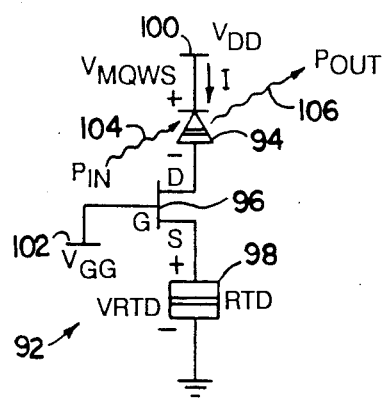
FIG. 13 depicts a two-terminal electrooptic switch.

Yet another embodiment of the invention is shown in FIG. 13. It is a two-terminal electrooptic switch 92 including an electrooptic device 94, a depletion-type FET 96 and an RTD 98 connected in series between a $V_{DD}$ voltage supply line 100 and ground, as shown. The drain terminal of FET 96 is connected to one terminal of device 94 and the source terminal of FET 96 is connected to one terminal of RTD 98. The gate terminal of FET 96 is connected to a $V_{GG}$ voltage supply line 102. Electrooptic device 94 is preferably a PIN/MQWS device such as the one depicted in FIG. 3 and is operated in its region of linear operation (e.g., region D of FIG. 7).

Figure 14:
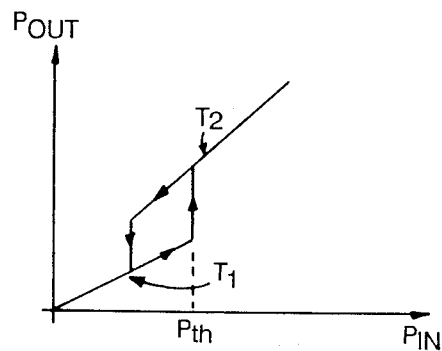
FIG. 14 illustrates the input-output characteristics of the device shown in FIG. 13.

In the switch 92, an input beam 104 yields an output beam 106 according to the characteristic shown in FIG. 14. At low power levels, the switch 92 has a transmissivity of $T_1$ and when the power level reaches a threshold level equal to $P_{th}$, the transmissivity of device 92 switches to a higher value, namely, $T_2$.

Figure 15A:
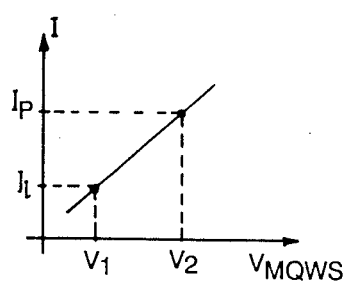
FIG. 15a–c illustrate the I-V characteristics of components of the electrooptic device shown in FIG. 13.
Figure 15B:
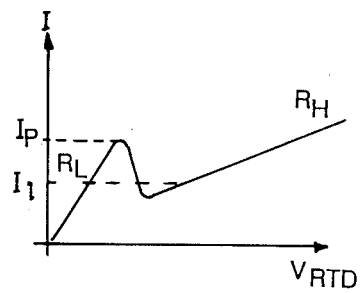
Figure 15C:
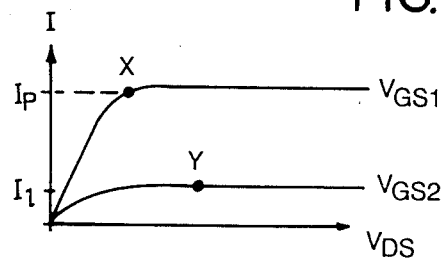

The operation of the switch 92 can be readily understood with the aid of the I-V characteristics of device 94, FET 96 and RTD 98, shown in FIGS. 15a–c, respectively. When the input beam 104 has low power, RTD 98 operates in its low resistance region of operation designated by $R_L$ in FIG. 15b. As the power of the input beam 104 increases, the current also increases until it reaches $I_p$, the peak current of RTD 96 just prior to entering its negative differential resistance region. As the power of the input beam 104 increases still further and the current attempts to increase, RTD 96 switches to its high resistance curve designated as $R_H$ and the voltage across RTD 96 jumps to a higher level.

FET 96 is selected so that when the current equals $I_p$, just prior to switching, FET 96 is operating at its knee as shown by point X in FIG. 15c. When the voltage across RTD 98 switches to a higher level thereby decreasing the gate-to-source voltage of FET 96, the drain-to-source voltage of FET 96 also increases as shown by point Y in FIG. 15c. Thus, FET 96 causes the change in voltage across device 94 to be greater in magnitude than the change in voltage across RTD 98 thereby generating a larger change in the transmissivity of device 94 than would have bee achievable by RTD 98 alone.

It should be appreciated that the other embodiments described above, namely, devices 80, 90, and 92 illustrated in FIGS. 10, 11 and 13, respectively, are also readily integratable as monolithic structures.

Having thus described illustrative embodiments of the invention, it will be apparent that various alterations, modifications and improvements will readily occur to those skilled in the art. Such obvious alterations, modifications and improvements, though not expressly described above, are nonetheless intended to be implied and ar within the spirit and scope of the invention. Accordingly, the foregoing discussion is intended to be illustrative only, and not limiting; the invention is limited and defined only by the following claims and equivalents thereto.

What is claimed is:

1. An electrooptical switch for modulating a bias light in response to an excitatory light beam, the switch comprising:
   a. a modulator for modulating the bias beam to produce an output beam therefrom, the modulator having a variable transmissivity;
   b. a detector module for receiving the excitatory beam and generating a control signal therefrom, the detector module being separate from the modulator and exhibiting switching operation in response to the excitatory beam; and
   c. an amplifier for amplifying the control signal to modulate the transmissivity of the modulator device.

2. An electrooptical switch as defined in claim 1 wherein the modulator is a PIN diode.

3. An electrooptical switch as defined in claim 2 wherein the PIN diode contains a multiple quantum well structure.

4. An electrooptical switch as defined in claim 1 wherein the amplifier is a field-effect transistor.

5. An electrooptical switch as defined in claim 1 wherein the detector module comprises:
   a. an excitatory optical detector adapted to receive the excitatory beam and produce a current which changes in response to changes in the excitatory beam; and
   b. a nonlinear component responsive to the current generated by the excitatory detector for generating the control signal, the nonlinear component having a current-voltage characteristic exhibiting nonlinear characteristics.

6. An electrooptical switch as defined in claim 5 wherein the excitatory detector is a photodiode.

7. An electrooptical switch as defined in claim 5 wherein the excitatory detector is a PIN diode.

8. An electrooptical switch as defined in claim 7 wherein the PIN diode contains a multiple quantum well structure.

9. An electrooptical switch as defined in claim 5 wherein the nonlinear component has a region of operation exhibiting negative differential resistance.

10. An electrooptical switch as defined in claim 9 wherein the nonlinear component is resonant tunneling diode.

11. An electrooptical switch as defined in claim 5 wherein the excitatory beam causes the transmissivity of the modulator to switch from a first level to a second level when its power reaches a preselected threshold and wherein the detector module further comprises an inhibitory optical detector for receiving an inhibitory beam and causing the preselected threshold to increase in response to the inhibitory beam.

12. An electrooptical switch as defined in claim 11 wherein the inhibitory optical detector is a photodiode.

13. An electrooptical switch as defined in claim 11 wherein the inhibitory optical detector is a PIN diode.

14. An electrooptical switch as defined in claim 13 wherein the PIN diode contains a multiple quantum well structure.

15. An electrooptical switch as defined in claim 11 wherein the nonlinear component has a region of operation exhibiting negative differential resistance and the detector module further comprises a current source for biasing the nonlinear component so that it has at least two stable points of operation in the absence of incident light on the inhibitory and excitatory detectors.

16. An electrooptical switch as defined in claim 15 wherein the current source is a field-effect transistor.

17. A two-terminal electrooptical switch which responds to an input beam to produce an output beam, the switch comprising:
   a. a modulator for receiving the input beam and producing a photocurrent therefrom, the modulator having a transmissivity which varies as a function of a voltage across the modulator;
   b. a nonlinear component connected to receive the current generated by the modulator and produce a corresponding voltage therefrom, the nonlinear component being separate from the modulator and having a region of operation exhibiting negative differential resistance; and
   c. an amplifier for amplifying the voltage produced by the nonlinear component and feeding the amplified voltage back to the modulator.

18. A two-terminal electrooptical switch as defined in claim 17 wherein the modulator is a PIN diode.

19. A two-terminal electrooptical switch as defined in claim 18 wherein the PIN diode contains a multiple quantum well structure.

20. A two-terminal electrooptical switch as defined in claim 17 wherein the amplifier is a field-effect transistor.

21. An electrooptical switch as defined in claim 17 wherein the nonlinear component is a resonant tunneling diode.

22. An electrooptical switch as defined in claim 1 wherein the modulator, the detector module and the amplifier are fabricated as part of a monolithic structure on a substrate.

23. An electrooptical switch as defined in claim 17 wherein the modulator, the nonlinear component and the amplifier are fabricated as part of a monolithic structure on a substrate.

24. An electrooptical switch for modulating a bias light beam in response to an excitatory light beam, the switch comprising:
   a. a modulator for modulating the bias beam to produce an output light beam therefrom, the modulator device having a variable transmissivity;
   b. a detector module for receiving the excitatory beam and generating a control signal therefrom, the detector module being separate from the modulator and exhibiting switching operation in response to the excitatory beam; and
   c. an amplifier for amplifying the control signal to modulate the transmissivity of the modulator device, wherein the modulator, the detector module, and the amplifier are fabricated as part of a monolithic structure on a substrate.

25. A two-terminal electrooptical switch which responds to an input light beam to produce an output beam, the switch comprising:
  a. a modulator for receiving the input beam and producing a photocurrent therefrom, the modulator having a transmissivity which varies as a function of a voltage across the modulator;
  b. a nonlinear component connected to receive the current generated by the modulator and produce a corresponding voltage therefrom, the nonlinear component being separate from the modulator and having a region of operation exhibiting negative differential resistance; and
  c. an amplifier for amplifying the voltage produced by the nonlinear component and feeding the amplified voltage back to the modulator, wherein the modulator, the nonlinear component, and the amplifier are fabricated as part of a monolithic structure on a substrate.

26. An electrooptical switch as defined in claim 24 wherein the substrate is GaAS.

27. An electrooptical switch as defined in claim 25 wherein the substrate is GaAS.

* * * * *

UNITED STATES PATENT AND TRADEMARK OFFICE
CERTIFICATE OF CORRECTION

PATENT NO.   :   4,985,621

DATED        :   January 15, 1991

INVENTOR(S)  :   Aull et al.

It is certified that error appears in the above-identified patent and that said Letters Patent is hereby corrected as shown below:

Col. 1, line 10; "invent" should be --invention--.
Col. 2, line 24; "on" should be --one--.
Col. 5, line 42; "8 and 9-b" should be --8 and 9a-b--.
Col. 6, line 48; "6" should be --60--.

Signed and Sealed this

Tenth Day of November, 1992

Attest:

DOUGLAS B. COMER

*Attesting Officer*          *Acting Commissioner of Patents and Trademarks*